(12) United States Patent
Kamimura et al.

(10) Patent No.: US 10,991,591 B2
(45) Date of Patent: Apr. 27, 2021

(54) REACTIVE ION ETCHING APPARATUS

(71) Applicant: ULVAC, INC., Kanagawa (JP)

(72) Inventors: Ryuichiro Kamimura, Kanagawa (JP); Yamato Osada, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 11 days.

(21) Appl. No.: 16/624,414

(22) PCT Filed: Dec. 6, 2018

(86) PCT No.: PCT/JP2018/044862
§ 371 (c)(1),
(2) Date: Dec. 19, 2019

(87) PCT Pub. No.: WO2019/146267
PCT Pub. Date: Aug. 1, 2019

(65) Prior Publication Data
US 2020/0219729 A1    Jul. 9, 2020

(30) Foreign Application Priority Data
Jan. 29, 2018   (JP) .............................. JP2018-012601

(51) Int. Cl.
*H01L 21/3065*   (2006.01)
*H01J 37/32*     (2006.01)
(Continued)

(52) U.S. Cl.
CPC .... *H01L 21/3065* (2013.01); *H01J 37/32091* (2013.01); *H01L 21/6833* (2013.01); *H05H 1/46* (2013.01)

(58) Field of Classification Search
CPC .............. H01L 21/3065; H01L 21/6833; H01J 37/32091; H05H 1/46
(Continued)

(56) References Cited

U.S. PATENT DOCUMENTS 6,492,612 B1 * 12/2002 Taguchi ............ H01L 21/67069
                                              219/121.43
2006/0000803 A1 * 1/2006 Koshiishi .......... H01J 37/32082
                                              216/67
(Continued)

FOREIGN PATENT DOCUMENTS

JP    2000-252267 A     9/2000
JP    2007-109770 A     4/2007
JP    2011-228436 A    11/2011

OTHER PUBLICATIONS

International Search Report and Written Opinion for PCT Patent App. No. PCT/JP2018/044862 (dated Feb.12, 2019) with English translation of the ISR.

*Primary Examiner* — Binh X Tran
(74) *Attorney, Agent, or Firm* — Cermak Nakajima & McGowan LLP; Tomoko Nakajima

(57) ABSTRACT

The reactive ion etching apparatus of this invention has a stage provided with an electrostatic chuck having a pair of electrodes. At the time of etching a to-be-processed substrate, by applying DC voltage to the pair of electrodes, the to-be-processed substrate is electrostatically absorbed to the electrostatic chuck. In this reactive ion etching apparatus, a radio-frequency power source connected to the stage, through a first output line, applies bias potential to the to-be-processed substrate. The radio-frequency power source is also arranged to be connected through a second output line to the pair of electrodes so as to apply radio-frequency potential in a manner to be superposed on the DC voltage. The first capacitor and the second capacitor are respectively interposed in the first output line and the second output line. A capacitance ratio of the first capacitor to the second capacitor is set to a range of 2.5 to 25.

2 Claims, 1 Drawing Sheet

(51) Int. Cl.
*H01L 21/683* (2006.01)
*H05H 1/46* (2006.01)

(58) Field of Classification Search
USPC ............. 156/345.44, 345.45, 345.47, 345.51
See application file for complete search history.

(56) References Cited

U.S. PATENT DOCUMENTS

| | | | |
|---|---|---|---|
| 2007/0127188 A1* | 6/2007 | Yang ................ | H01J 37/32706 361/234 |
| 2010/0072172 A1* | 3/2010 | Ui ..................... | H01J 37/32009 216/67 |
| 2016/0027615 A1* | 1/2016 | Ishiguro ............ | H01J 37/32706 156/345.28 |
| 2016/0336185 A1* | 11/2016 | Ishiguro ............ | H01J 37/32706 |
| 2018/0261481 A1* | 9/2018 | Eto ................... | G01K 11/3213 |
| 2019/0088520 A1* | 3/2019 | Kraus ............... | H01J 37/32715 |
| 2019/0103254 A1* | 4/2019 | Lane ................. | H01L 21/67069 |
| 2019/0180986 A1* | 6/2019 | Torii ................. | H01L 21/3065 |

* cited by examiner

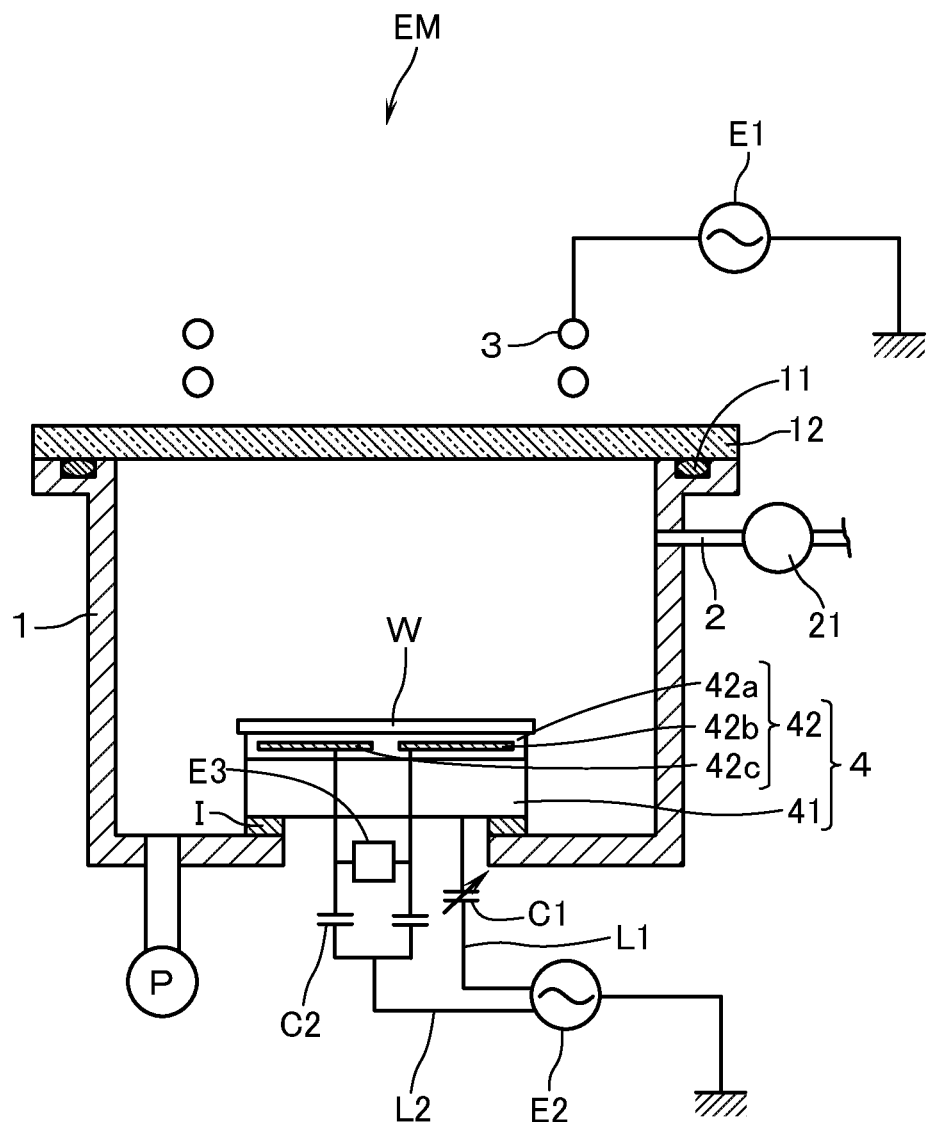

REACTIVE ION ETCHING APPARATUS

This application is a national phase entry under 35 U.S.C. § 371 of PCT Patent Application No. PCT/JP2018/044862, filed on Dec. 6, 2018, which claims priority under 35 U.S.C. § 119 to Japanese Patent Application No. 2018-012601, filed Jan. 29, 2018, both of which are incorporated by reference.

TECHNICAL FIELD

The present invention relates to a reactive ion etching apparatus.

BACKGROUND ART

In the steps of manufacturing, e.g., a semiconductor device, there has conventionally been used a reactive ion etching apparatus which utilizes vacuum atmosphere in order to selectively remove metallic films and insulating films that are formed on the surface of a substrate such as a silicon wafer and the like. This reactive ion etching apparatus generally comprises: a stage on which a substrate to be processed (hereinafter referred to as a "to-be-processed substrate") is disposed inside a vacuum chamber; a gas introduction means for introducing an etching gas into the vacuum chamber in vacuum atmosphere; a plasma generation means for generating inside the vacuum chamber a plasma which ionizes the introduced etching gas; and a radio-frequency power source which is connected to the stage through an output line so as to apply bias potential to the to-be-processed substrate.

Now, to-be-processed substrates have recently become larger in area, and it is required that a substantially uniform etching rate be obtainable over the entire in-plane direction of the to-be-processed substrates even with this kind of to-be-processed substrates. There is known conventional art in, e.g., Patent Document 1, in which is disclosed that two sets of radio-frequency power sources are used to thereby respectively supply a first electrode (inside electrode) and a second electrode (outside electrode) with radio-frequency power of different frequencies, the first and the second electrodes being disposed on a stage in a state of being electrically insulated from each other. In this arrangement, by varying the power ratio to be applied to the first electrode and the second electrode, the distribution of the bias potential to be applied to the to-be-processed substrate is changed, thereby obtaining a substantially uniform etching rate over the entire to-be-processed substrate.

However, since the above-mentioned conventional example employs two radio-frequency power sources (and distributors), there is a problem in that the costs for the apparatus become expensive and also that the arrangement of the apparatus becomes complicated. By the way, in case the to-be-processed substrate is subjected to etching processing by using the above-mentioned reactive ion etching apparatus, it sometimes happens that the to-be-processed substrate is controlled at a predetermined temperature. In such a case, it is normal practice to build into the stage a heating means and a cooling means, and also to provide the stage with a so-called electrostatic chuck. Since the electrostatic chuck is ordinarily provided with a pair of electrodes for electrostatically absorbing the to-be-processed substrate, they can be used to advantage in order to reduce the apparatus cost and to simplify the apparatus arrangement.

PRIOR ART DOCUMENTS

Patent Documents

Patent Document 1: JP-2011-228436-A

SUMMARY OF THE INVENTION

Problems that the Invention is to Solve

In view of the above-mentioned points, this invention has a problem of providing a reactive ion etching apparatus which is low in cost and simple in construction and also which is capable of obtaining a substantially uniform etching rate over the entire in-plane direction of the to-be-processed substrate.

Means for Solving the Problems

In order to solve the above-mentioned problems, a reactive ion etching apparatus comprises: a stage on which a to-be-processed substrate is disposed inside a vacuum chamber; a gas introduction means for introducing an etching gas into the vacuum chamber in vacuum atmosphere; a plasma generation means for generating inside the vacuum chamber a plasma which ionizes the introduced etching gas; a radio-frequency power source connected to the stage through a first output line so as to apply bias potential to the to-be-processed substrate; the stage being provided with an electrostatic chuck having a pair of electrodes so that, at the time of etching the to-be-processed substrate, DC voltage is applied to the pair of electrodes, whereby the to-be-processed substrate is electrostatically absorbed to the electrostatic chuck. In the reactive ion etching apparatus: the radio-frequency power source is arranged to be connected, through a second output line, to the pair of electrodes so as to apply radio-frequency potential in a manner to be superposed on the DC voltage; both a first capacitor and a second capacitor are interposed respectively in the first output line and the second output line; and a capacitance ratio of the first capacitor to the second capacitor is set to a range of 0.25 to 25.

According to this invention, at the time of etching the to-be-processed substrate, by making use of the pair of electrodes of the electrostatic chuck, the radio-frequency potential is applied in a manner to be superposed on the DC power that is applied in electrostatically absorbing the to-be-processed substrate. At this time, the capacitance ratio of the first capacitor to the second capacitor is set to a range of 0.25 to 25. Therefore, the distribution of the bias potential that is applied to the to-be-processed substrate is adjusted so that a substantially uniform etching rate comes to be obtainable over the entire surface of the to-be-processed substrate. In this manner, according to this invention, while maintaining the function in that a substantially uniform etching rate can be obtained over the entire surface of the to-be-processed substrate, bias potential is applied by a single radio-frequency power source by making use of the pair of electrodes of the electrostatic chuck. Therefor, as compared with the above-mentioned conventional case in which two radio-frequency power sources are used, the arrangement of the apparatus can be simplified and the apparatus costs can be reduced.

In this invention, in order to enable to appropriately adjust the distribution of the bias potential depending on the to-be-processed object (metallic film and insulating film), at least one of the first capacitor and the second capacitor shall preferably be a variable capacitor whose capacitance is variable.

BRIEF DESCRIPTION OF THE DRAWINGS

FIG. 1 is a sectional view to schematically explain the constitution of an embodiment of the etching apparatus of this invention.

MODES FOR CARRYING OUT THE INVENTION

Hereinbelow, with reference to the drawing, a description will now be made of an embodiment of a reactive etching apparatus of this invention (hereinafter referred to as an "etching apparauts"). In the following description, the terms referring to the directions shall be based on FIG. 1.

With reference to FIG. 1, reference mark EM denotes an etching apparatus. The etching apparatus EM is provided with a vacuum chamber 1 which is capable of forming a vacuum atmosphere by evacuation with a vacuum pump P. An upper opening of the vacuum chamber 1 has mounted thereon, through a vacuum seal 11 such as an O-ring and the like, a ceiling plate 12 made of a dielectric material such as quartz and the like. The side wall of the vacuum chamber 1 has connected thereto a gas pipe 2 which is in communication with a gas source (not illustrated). The gas pipe 2 has interposed therein a mass flow controller 21. It is thus so arranged that an etching gas can be introduced into the vacuum chamber 1 in a predetermined amount. The etching gas is appropriately selected depending on the object to be subjected to etching. For example, in case metallic films such as of aluminum, tungsten, and the like, are to be subjected to etching, chlorine gases such as $Cl_2$, $BCl_3$, $CCl_4$ and the like are mainly used and, depending on the necessity, inert gas and the like as diluent gas is added. The gas pipe 2 and the mass flow controller 21 constitute the "gas introduction means" of this invention.

Above the ceiling plate 12 there are provided a plurality of stages (two stages in this embodiment) of loop antenna coils 3. Output from the radio-frequency power source E1 is connected to these antenna coils 3 so that the radio-frequency power for plasma generation can be supplied. These antenna coils 3 and the radio-frequency power source E1 can constitute "plasma generation means" of this invention. At the bottom portion inside the vacuum chamber 1 there is disposed a stage 4.

The stage 4 is provided with: a base 41 which is disposed, through an insulating body I, at the bottom of the vacuum chamber 1, and which is constituted by a tubular body made of a metallic cylindrical material; and an electrostatic chuck 42 which is disposed on an upper surface of the base 41. Although not explained in detail in illustration, the base 41 has built therein: a heating means having a heater, and the like; and a cooling means having coolant circulation passages. It is thus so arranged that, at the time of etching, the to-be-processed substrate W can be heated or cooled to a predetermined temperature. The base 41 has further connected thereto, through a first output line L1, a radio-frequency power source E2. It is thus so arranged that, at the time of etching, by supplying the radio-frequency power of a predetermined frequency from the radio-frequency power source E2, bias potential can be applied to the to-be-processed substrate W.

The electrostatic chuck 42 has: a chuck plate 42a which is closely adhered to the upper surface of the base 41 and which is made of a dielectric; and a pair of electrodes 42b, 42c which are buried in the chuck plate 42a. To both the electrodes 42b, 42c there is respectively connected an output cable from a DC power source E3. It is thus so arranged that, by applying predetermined DC voltage across the pair of electrodes 42b, 42c, the to-be-processed substrate W can be electrostatically absorbed to the upper surface of the chuck plate 42a. Although not explained by particularly illustrating, both the electrodes 42b, 42c are respectively constituted by, e.g., metal plates formed into the shape of a comb, and are disposed such that the tooth portions thereof, in a posture of being in mesh with each other, are present substantially over the entire area of the same plane of the chuck plate 42a. However, the shape, the manner of disposing, and the like of each of the electrodes 42b, 42c shall not be limited to the above.

Now, when a substantially uniform etching rate must be obtained, with reference to the to-be-processed substrate W, over the entire in-plane direction of the to-be-processed substrate, it is necessary to make substantially uniform the distribution of the bias potential to be applied to the to-be-processed substrate W when radio-frequency power of predetermined frequency is supplied by the radio-frequency power source E2. In this embodiment it is so arranged: that the radio-frequency power source E2 is connected also to the pair of electrodes 42b, 42c through the second output line L2; and that radio-frequency potential can be applied to the pair of electrodes 42b, 42c in a manner to be superposed on the above-mentioned DC voltage. In this arrangement, the first and the second output lines L1, L2 have interposed therein a first capacitor C1 and a second capacitor C2, respectively. In this embodiment, a variable capacitor is used as the first capacitor C1 and a fixed capacitor is used as the second capacitor C2. As the variable capacitor C1, there may be cited an example whose capacitance is variable, e.g., between 12.5 and 5000 pF and, as the fixed capacitor C2, there may be cited an example having a predetermined capacitance, e.g., between 50 and 200 pF. As to the kind of the fixed capacitor C2, selection may appropriately be made out of an electrolytic capacitor, ceramic capacitor, film capacitor, electric double-layer capacitor, and the like.

At the time of etching, taking into consideration, e.g., the object to be subjected to etching (metallic film or insulating film), etching conditions (kind of etching gas and the pressure at the time of etching), as well as the shape and the like of the electrodes 42b, 42c, the capacitance of the first capacitor C1 is appropriately changed so that the capacitance ratio of the first capacitor C1 to the second capacitor C2 is set to a range of 0.25 to 25. In case the capacitance ratio lies outside the range of 0.25 to 25, there is a possibility of giving rise to a problem in that in-plane uniformity at the desired etching rate cannot be obtained.

The above-mentioned etching apparatus EM has, although not illustrated, a known control means provided with a microcomputer, sequencer, and the like. The control means performes an overall control of: the operation of the above-mentioned respective power sources E1, E2, E3; the operation of the massflow controller 21; the operation of the vacuum pump; and the like. Aside from the above, the control means also adjusts the capacitance ratio of the variable capacitor C1 to the fixed capacitor C2 by adjusting the capacitance of the variable capacitor C1. On condition that the to-be-processed substrate W has formed on the surface of a silicon substrate an aluminum film, descrition will hereinbelow be made of a method of etching the aluminum film by using the above-mentioned etching apparatus EM.

First, in a state in which, by operating the vacuum pump P, the vacuum chamber 1 has been evacuated to a desired vacuum degree (e.g., 0.5 Pa), the to-be-processed substrate W is transferred, by using a transfer robot (not illustrated), onto a chuck plate 42a of the stage 4. Then, DC voltage is applied from the DC power source E3 to the pair of electrodes 42b, 42c of the electrostatic chuck 42. The to-be-processed substrate W is thereby electrostatically absorbed to the upper surface of the chuck plate 42a. Thereafter, by controlling the massflow controller 21, chroline gas is introduced into the vacuum chamber 1 at a flow rate of 20 to 200 sccm and, at the same time, by supplying radio-frequency power of, e.g., 13.56 MHz from the radio-frequency power source E1 to the antenna coil 3 at 100 W to 1000 W, a plasma is caused to be generated inside the vacuum chamber 1. Together with the above operations, by supplying radio-frequency power of, e.g., 12.5 MHz from the radio-frequency power source E2 to the stage 4 at 20 to 600 W, bias potential is applied to the to-be-processed substrate W. According to these operations, the ions that have been dissociated in the plasma are attracted to the surface of the to-be-processed substrate W, thereby performing dry etching of the aluminum film.

By the way, even with reference to a to-be-processed substrate W that has become large in area, a subtantially uniform etching rate be sometimes required recently over the entire in-plane direction of the to-be-processed substrate. In order to meet this requirement, in the above-mentioned conventional example, two radio-frequency power sources are used, and radio-frequency power of different frequencies is respectively supplied to two electrodes that are disposed on the stage, thereby adjusting the distribution of the bias potential. This solution, however, is expensive in the apparatus costs and is also complicated in the apparatus arrangement.

As a solution, according to this embodiment, it is so arranged that, at the time of etching the to-be-processed substrate W, radio-frequency potential is applied from the radio-frequency power source E2 to the pair of electrodes 42b, 42c in a manner to be superposed on the DC voltage. At this time, by setting the capacitance ratio of the first capacitor C1 to the second capacitor C2 to a range of 0.25 to 25, the distribution of the bias potential to be applied to the to-be-processed substrate W is adjusted and, as a result, substantially uniform etching rate can be obtained over the entire surface of the to-be-processed substrate W. According to the experiments to be described hereinafter, it has been confirmed that the in-plane uniformity of the etching rate of the aluminum film was able to be increased below ±3.5%, more preferably below ±2.0%. By the way, by constituting the pair of electrodes 42b, 42c respectively in metallic plate-shaped members, and by disposing each of the electrodes 42b, 42c so as to be present substantially over the entire surface of the absorption surface of the to-be-processed substrate W, it is possible to effectively adjust the distribution of the bias potential. As described, according to this embodiment, while it maintains the function in that substantially uniform etching rate can be obtained over the entire surface of the to-be-processed substrate W, the bias potential is applied by a single radio-frequency power source E2 by making use of the pair of electrodes 42b, 42c of the electrostatic chuck 42. Therefore, as compared with the above-mentioned conventional example in which two bias radio-frequency power sources (and distributors) are used, the apparatus arrangement of this embodiment can be made simpler and the apparatus cost can be reduced.

By the way, if the object to be subjected to etching (such as metallic films, insulating films, and the like) and etching conditions (kind of etching gas, pressure at the time of etching) are different, there is a case in which distribution of the bias potential changes, the bias potential being the one at which a substantially uniform etching rate can be obtained over the entire surface of the to-be-processed substrate W. In this case, by constituting at least one of the first capacitor C1 and the second capacitor C2 by a variable capacitor, the distribution of the bias potential can advantageously be adjusted depending on the object to be subjected to etching, or the etching conditions.

Next, in order to confirm the above-mentioned effect, the following experiments were carried out using the above-mentioned etching apparatus EM. In these experiments, the substrate W is defined to be the one in which an aluminum film was formed, by a sputtering method, to a thickness of about 300 nm on a silicon substrate W. This aluminum film was subjected to etching on the following conditions. In other words, the flow rate of the chlorine gas (e.g., $Cl_2$, $BCl_3$) was set at 50 sccm, 50 sccm (the pressure inside the vacuum chamber 1 at this time was 0.5 Pa); the bias power to be supplied to the stage 4 was set to 12.5 MHz, 150 W; power to be supplied to the antenna coil 3 was set to 13.56 MHz, 300 W; and DC volatage to be applied to the electrostatic chuck 42 was set to 1.0 kV. Here, as the first capacitor C1 a variable capacitor whose capacitance is variable was used. As the second capacitor C2 a fixed capacitor whose capacitance is fixed (200 pF) was used, and the capacitance of the variable capacitor C1 was adjusted to 2500 pF (the capacitance ratio of the first capacitor C1 to the second capacitor C2 at this time was 12.5, hereinafter referred to as "Invention Experiment 1"). The film thicknesses of the aluminum film before and after etching in the Invention Experiment 1 were measured at 7 points, respectively, in the radial direction of the to-be-processed substrate W. An average value of the etching rate as obtained from the above-mentioned measured values was 350 nm/min., and the in-plane uniformity was ±1.8%.

Except for the point that the capacitance of the variable capacitor C1 was changed to 50 pF, 500 pF, 1500 pF, 3000 pF, 4000 pF, and 5000 pF (hereinafter referred to as "Invention Experiment 2", "Invention Experiment 3", "Invention Experiment 4", "Invention Experiment 5", "Invention Experiment 6", and "Invention Experiment 7" respectively), etching was performed in a manner similar to that in the above-mentioned Invention Experiment 1, and then average values of the etching rate and the in-plane uniformity were obtained. They were found to be 350 nm/min±3.5% in Invention Experiment 2 (capacitance ratio=0.25); 360 nm/min±2.8% in Invention Experiment 3 (capacitance ratio=2.5); 353 nm/min±2.0% in Invention Experiment 4 (capacitance ratio=7.5); 345 nm/min±2.0% in Invention Experiment 5 (capacitance ratio=15); 343 nm/min±2.5% in Invention Experiment 6 (capacitance ratio=20); and 339 nm/min±3.4% in Invention Experiment 7 (capacitance ratio=25).

For the purpose of comparison with the above-mentioned Invention Experiments 1 to 7, except for the point that the capacitance of the variable capacitor C1 was changed to 40 pF, 6000 pF (the capacitance ratio at this time=0.2, 30) (hereinafter referred to as "Comparative Experiment 1", "Comparative Experiment 2"), etching was performed in a manner similar to that in the above-mentioned Invention Experiment 1, and then average values of the etching rate and the in-plane uniformity were obtained. They were found to be 347 nm/min±3.7% in Comparative Experiment 1 (capacitance ratio=0.2); and 332 nm/min±4.7% in Comparative Experiment 2 (capacitance ratio=30). The results of these Invention Experiments 1 to 7 and of Comparative Experiments 1 and 2 are summarized in TABLE 1.

TABLE 1

|  | C1 | C2 |  | Etching rate | |
| --- | --- | --- | --- | --- | --- |
|  | Capacitance (pF) | Capacitance (pF) | Capacitance Ratio | Average values (nm/min) | In-plane uniformity (%) |
| Comparative Experiment1 | 40 | 200 | 0.2 | 347 | ±3.7 |
| Invention Experiment 2 | 50 | 200 | 0.25 | 350 | ±3.5 |
| Invention Experiment 3 | 500 | 200 | 2.5 | 360 | ±2.8 |
| Invention Experiment 4 | 1500 | 200 | 7.5 | 353 | ±2.0 |
| Invention Experiment 1 | 2500 | 200 | 12.5 | 350 | ±1.8 |
| Invention Experiment 5 | 3000 | 200 | 15 | 345 | ±2.0 |
| Invention Experiment 6 | 4000 | 200 | 20 | 343 | ±2.5 |
| Invention Experiment 7 | 5000 | 200 | 25 | 339 | ±3.4 |
| Comparative Experiment2 | 6000 | 200 | 30 | 332 | ±4.7 |

According to the above-mentioned experiments, the following have been confirmed: that, by making the capacitance ratio of the first capacitor C1 to the second capacitor C2 to the range of 0.25 to 25, the in-plane uniformity was able to lie within ±3.5%; and that substantially uniform etching rates were able to be obtained over the entire surface of the to-be-processed substrate W. Further, by making the capacitance ratio to the range of 7.5 to 15, the in-plane uniformity was able to lie within ±2.0%. It has thus been confirmed that further uniform etching rates were obtained. From these experiments, it has been found that the distribution of the bias potential to be applied to the to-be-processed substrate W can be effectively adjusted.

A description has so far been made of the embodiment of this invention, but this invention shall not be limited to the above. In the above-mentioned embodiment, the description was made of an example in which the first capacitor C1 was made to be a variable capacitor and in which the second capacitor C2 was made to be a fixed capacitor. Preferably, however, at least one of the first capacitor C1 and the second capacitor C2 shall be a variable capacitor. For example, the first capacitor C1 may be made to be a fixed capacitor and the second capacitor C2 may be made to be a variable capacitor. Also in this case, the distribution of the bias potential can appropriately be adjusted depending on the object to be subjected to etching as well as on the etching conditions.

In the above-mentioned embodiment, a description was made of an example in which the object to be subjected to etching was a metallic film (aluminum film). This invention can, however, be applicable to a case in which the object to be subjected to etching is an insulating film.

EXPLANATION OF MARKS

C1 variable capacitor (first capacitor)
C2 fixed capacitor (second capacitor)
E2 radio-frequency power source
E1 radio-frequency power source (plasma generation means)
EM reactive ion etching apparatus (plasma processing apparatus)
L1 first output line
L2 second output line
1 vacuum chamber
2 gas pipe (gas introduction means)
21 mass flow controller (gas introduction means)
3 coil (plasma generation means)
4 stage
42 electrostatic chuck
42b, 42c a pair of electrodes

The invention claimed is:

1. A reactive ion etching apparatus comprising:
a stage on which a to-be-processed substrate is disposed inside a vacuum chamber;
a gas introduction means for introducing an etching gas into the vacuum chamber in vacuum atmosphere;
a plasma generation means for generating inside the vacuum chamber a plasma which ionizes the introduced etching gas;
a radio-frequency power source connected to the stage through a first output line so as to apply bias potential to the to-be-processed substrate;
the stage being provided with an electrostatic chuck having a pair of electrodes so that, at the time of etching the to-be-processed substrate, DC voltage is applied to the pair of electrodes, whereby the to-be-processed substrate is electrostatically absorbed to the electrostatic chuck;
wherein: the radio-frequency power source is arranged to be connected, through a second output line, to the pair of electrodes so as to apply thereto radio-frequency potential in a manner to be superposed on the DC voltage;
both a first capacitor and a second capacitor are interposed respectively in the first output line and the second output line; and
a capacitance ratio of the first capacitor to the second capacitor is set to a range of 2.5 to 25.

2. The reactive ion etching apparatus according to claim 1, wherein at least one of the first capacitor and the second capacitor is a variable capacitor whose capacitance is variable.

\* \* \* \* \*